United States Patent
Saxena et al.

(10) Patent No.: US 7,853,915 B2
(45) Date of Patent: Dec. 14, 2010

(54) INTERCONNECT-DRIVEN PHYSICAL SYNTHESIS USING PERSISTENT VIRTUAL ROUTING

(75) Inventors: Prashant Saxena, Portland, OR (US); Vishal Khandelwal, Hillsboro, OR (US); Changge Qiao, Santa Clara, CA (US); Pei-Hsin Ho, Portland, OR (US); Jing C. Lin, Cupertino, CA (US); Mahesh A. Iyer, Fremont, CA (US)

(73) Assignee: Synopsys, Inc., Mountain View, CA (US)

( * ) Notice: Subject to any disclaimer, the term of this patent is extended or adjusted under 35 U.S.C. 154(b) by 347 days.

(21) Appl. No.: 12/145,405

(22) Filed: Jun. 24, 2008

(65) Prior Publication Data

US 2009/0319977 A1    Dec. 24, 2009

(51) Int. Cl.
*G06F 17/50* (2006.01)

(52) U.S. Cl. .............. 716/13; 716/1; 716/2; 716/5; 716/6; 716/12; 716/18; 703/13; 703/14

(58) Field of Classification Search .......... 716/1–2, 716/5–6, 12–13, 18; 703/13–14
See application file for complete search history.

(56) References Cited

U.S. PATENT DOCUMENTS

| | | | |
|---|---|---|---|
| 5,856,927 A * | 1/1999 | Greidinger et al. | ............ 716/12 |
| 6,353,918 B1 | 3/2002 | Carothers et al. | |
| 6,622,291 B1 | 9/2003 | Ginetti | |
| 7,222,311 B2 * | 5/2007 | Kaufman et al. | ............... 716/2 |
| 7,337,100 B1 * | 2/2008 | Hutton et al. | ................. 703/13 |
| 2003/0177455 A1 | 9/2003 | Kaufman et al. | |
| 2004/0243964 A1 | 12/2004 | McElvain et al. | |
| 2007/0016881 A1 | 1/2007 | Gregory et al. | |

OTHER PUBLICATIONS

Pan et al.: "FastRoute: A Step to Integrate Global Routing Into Placement", ICCAD '06, Nov. 5-9, 2006, San Jose, CA, Copyright 2006, 8 pgs.
Pedram et al.: "Layout Driven Technology Mapping", 28th ACM/IEEE Design Automation Conference, 1991 ACM, pp. 99-105.
Alpert et al.: "Prim-Dijkstra Tradeoffs for Improved Performance-Driven Routing Tree Design", IEEE Transactions on Computer-Aided Design of Integrated Circuits and Systems, vol. 14, No. 7, Jul. 1995, pp. 890-896.
Pan et al.: "IPR: An Integrated Placement and Routing Algorithm", DAC 2007, Jun. 4-8, 2007, San Diego, CA, Copyright 2007, pp. 59-62.

(Continued)

*Primary Examiner*—Nghia M Doan
(74) *Attorney, Agent, or Firm*—Bever, Hoffman & Harms, LLP; Jeanette S. Harms

(57) ABSTRACT

A persistence-driven optimization technique is provided in which nets can be ranked based on unpredictability and likely quality of result impact. The top nets in that ranking can be routed and their parasitics extracted. A timing graph can be back-annotated with route-based delays and parasitics for the selected nets. At this point, synthesis can be run using actual route-based delays and parasitics for the selected nets, with their routes being updated incrementally as needed. In one embodiment, the nets can be re-ranked after synthesis. Finally, these routes can be preserved across the subsequent global routing of the remaining nets.

51 Claims, 9 Drawing Sheets

OTHER PUBLICATIONS

Stenz et al.: "Performance Optimization by Interacting Netlist Transformations and Placement", IEEE Transactions on Computer-Aided Design of Integrated Circuits and Systems, vol. 19, No. 3, Mar. 2000, pp. 350-358.

Cheng: "RISA: Accurate and Efficient Placement Routability Modeling", 1994 ACM, pp. 690-695.

Alpert et al.: "Fast and Flexible Buffer Trees That Navigate the Physical Layout Environment", DAC 2004, Jun. 7-11, 2004, San Diego, CA, Copyright 2004, pp. 24-29.

Chu et al.: "FLUTE: Fast Lookup Table Based Rectilinear Steiner Minimal Tree Algorithm for VLSI Design", IEEE Transactions on Computer-Aided Design of Integrated Circuits and Systems, vol. 27, No. 1, Jan. 2008, pp. 70-83.

Ren et al.: "Sensitivity Guided Net Weighting for Placement-Driven Syntheses", IEEE Transactions on Computer-Aided Design of Integrated Circuits and Systems, vol. 24, No. 5, May 2005; pp. 711-721.

Chen et al.: "Refined Single Trunk Tree: A Rectilinear Steiner Tree Generator for Interconnect Prediction", SLIP'02, Apr. 6-7, 2002, San Diego, CA Copyright 2002, pp. 85-89.

Chowdhary et al.: "How Accurately Can We Model Timing in a Placement Engine?", DAC 2005, Jun. 13-17, 2005, Anaheim, CA, Copyright 2005, pp. 801-806.

\* cited by examiner

INTERCONNECT-DRIVEN PHYSICAL SYNTHESIS USING PERSISTENT VIRTUAL ROUTING

BACKGROUND OF THE INVENTION

1. Field of the Invention

The present invention relates to physical synthesis and in particular to interconnect-driven physical synthesis using persistent virtual routing.

2. Related Art

In modern process technologies, accurately predicting interconnect delays has become one of the critical steps in high performance integrated circuit (IC) designs. Notably, in the 65 nm regime and beyond, interconnect delays can change dramatically depending on the routing topology and layer assignment. As a result, the pin-to-pin delays and parasitics of a net estimated from a virtual router during circuit optimization at the pre-route stage may be very different from its actual delay after routing.

This difference in pin-to-pin delays and parasitics may significantly mislead the circuit optimization trajectory, e.g. leading to wasted over-optimization effort (during pre-routing optimization) on nets that are not really critical. Additionally, truly critical nets may be left un-optimized by circuit optimization steps applied during the pre-route stage, thereby requiring expensive optimization steps during post-route optimization (which tends to be considerably less flexible than pre-route optimization). As a result, design convergence becomes difficult due to this unpredictability in the design flow and often leads to ICs with inferior performance.

During the last decade, the fanout-based wireload models used by traditional synthesis have been augmented with placement-based models for the delays and parasitics of the nets as part of the widespread adoption of physical synthesis. Early physical synthesis techniques used simple half-rectangle perimeter (HRPM) based wirelength estimates for the nets during circuit optimization at the pre-route stage. However, although the HRPM metric is an exact measure for the minimum wirelength of a net that contains two or three pins, it may significantly underestimate even the best possible wirelength required to route a multi-pin net.

As wire delays became more significant (largely a result of process scaling), this weakness of simple HRPM-based wire length estimation was rectified with empirical fanout compensation factors. Unfortunately, even this enhancement failed to provide good estimates for driver-to-sink wirelengths or side-load parasitics for multi-pin nets. As a result, the use of virtual routers gained widespread acceptance for the purpose of wire delay estimation. These virtual routers ranged from simple greedy tree topology generation schemes to more sophisticated heuristics.

An exemplary virtual router uses Steiner trees, wherein given a set of points (vertices), the length of interconnect connecting such points can be minimized by adding one or more intermediate vertices. For example, FIG. 1A illustrates a routing generated by a virtual router (without the use of Steiner trees) in which a driver 101 drives cells 102, 103, and 104 using interconnect 105, 106, and 107. In contrast, FIG. 1B illustrates a Steiner tree based routing generated by a virtual router in which driver 101 drives cells 102, 103, and 104 using interconnect 108. Even though Steiner trees can provide a better approximation of the actual topologies generated by global routers, they still suffer from several problems that gradually became more serious with the poor scaling of wire delays.

Note that because topology generation by a virtual router of the kind described above is oblivious to congestion, routing estimates can represent minimal wire lengths. Specifically, these routing estimates fail to model the effect of routing detours on the parasitics and delays of the nets. Early efforts to tackle this problem relied on blockage-aware route embeddings to capture the detours caused by hard macros. For example, FIG. 1C illustrates a driver 120 driving a cell 121 using an interconnect 124. However, because of congestion in the narrow channel between the macros 122 and 123, driver 120 may drive cell 121 using interconnect 125, which is considerably longer than interconnect 124. A global router can be used to generate an approximate congestion map once the placement is stabilized. This congestion map can then be used by the subsequent net topology generation algorithms. Unfortunately, this technique has significant computation cost.

Early Steiner-based wire delay estimation schemes attempted to capture the complexities of layer assignment by relying on average layer parasitics. Although this averaging sufficed in early process technologies in which the wire delays were comparatively small, the lack of accurate layer and via modeling can result in large estimation errors in modern designs in which vias can be highly resistive and variable, and different metal layers can yield vastly different delays. Referring to FIGS. 1D and 1E, driver 130 drives cell 131 via one of interconnects 132 or 133, respectively. Interconnect 132 and 133 are the same length, but are formed in different layers and therefore can result in different delays. For example, an RC delay for a 1 mm long copper wire at the 68 nm node can vary from 209 ps to 767 ps depending on its layer. In general, the propagation delay for long wires is significantly higher when routed in a lower metal layer than when routed in an upper metal layer. Unfortunately, virtual routers are ill-equipped to predict which layer will ultimately be used for any particular wire.

Note that in the case of a relatively long wire, significantly more buffers may be needed on the lower metal layer compared to the upper metal layer. In fact, in general, the different routing paths shown in FIGS. 1A, 1B, 1C, 1D, and 1E can also result in a different number of buffers needed to drive the routing paths, different sizes for such buffers, and different sizes of the sink gates associated with such buffers. All of the foregoing undesirably causes additional congestion, potential re-routing, and overall greater uncertainty in the placement process.

The problematic divergence of routing estimates (which is in part caused because of the topology generation algorithms used by the virtual router for estimation purposes being significantly different from those used by the actual global routers) can be partly solved by using a fast global router for the estimation of routing topologies during the placement stage itself. That is, the same topology generation algorithms can be used for estimation and for routing. Unfortunately, even though this technique can accurately model layer-specific congestion and vias, it also has significant computation overhead.

Yet further, the topology generated by the global router for any given net can be very different from the one that had been used for its delay estimation. That is, a global router may generate very different topologies for the same net in response to small differences in the congestion map. This problem could conceivably be resolved by guaranteeing the routes used for estimation by fixing their routes when first generated, and then treating them as pre-routed nets subsequently. However, this simple approach is impractical because of several reasons. First, generating high quality congestion-aware routes for all the nets during placement-based circuit optimization is prohibitively expensive. Second, as the circuit optimization proceeds, previously-generated routes become invalid because of buffering, logic restructuring, changes in cell sizes and/or cell placement. Third, even if the routes are generated in a congestion-aware manner, fixing even a significant fraction of the nets has a huge impact on route completion during the final global routing phase due to the restrictions it places on the rip-up-and-reroute engine (that is not allowed to modify these pre-routed nets).

Therefore, a need arises for improved techniques that can cost-effectively take into account accurate delay and parasitic estimates in the placement stage.

SUMMARY OF THE INVENTION

In modern designs, the delay of a net can vary significantly depending on its routing. Unfortunately, a large estimation error during the pre-routing stage can often mislead the optimization of the netlist. In contrast to conventional interconnect-driven physical synthesis, persistent virtual routing can advantageously guarantee net routes for the most sensitive nets in order to drive circuit optimization while minimizing the routability impact. Persistent virtual routing can yield significant performance improvements in a cutting-edge industrial physical synthesis flow.

The "persistence" as used herein refers to guaranteeing the routes for some judiciously selected nets before routing (e.g. during placement-based optimization) and then using actual parasitics and net delays for those selected nets during subsequent placement-based optimization steps. Such persistence can achieve accuracy and predictability with minimal impacts to the routability of the design.

In accordance with one aspect of persistence, the nets of the design can be filtered based on one or more predetermined criteria. Exemplary predetermined criteria can include bounding box size, whether a net lies on a path having negative slack or small positive slack, fanout of the net (which is defined as the number of sink pins driven by the net), and/or electrical sensitivity. After filtering, the remaining nets can be ranked using one or more cost functions.

As used herein, the slack of a net can be defined as the timing slack of the most critical path passing through that net. In one embodiment, the cost function for a net can be based on the electrical sensitivity of that net. In another embodiment, the cost function of a net can be based on a product of a function that depends on its slack, a function that depends on its delay, and a function that depends on its fanout. In yet another embodiment, this cost function can be a product of a function that depends on the electrical sensitivity of the net with a function that depends on the fanout of the net. In yet another embodiment, this cost function can be a product of a function that depends on the electrical sensitivity of the net, a function that depends on the fanout of the net, and a function of the bounding box size of the net. In yet another embodiment, this cost function can be a product of a function that depends on the electrical sensitivity of the net, a function that depends on the fanout of the net, a function that depends on the delay of the net, and a function that depends on the slack of the net.

In one embodiment, the function that depends on the slack can be the timing slack of the net augmented by a predetermined margin (referred to as the slack offset), or a product of this augmented slack with a slack weight. In one embodiment, this slack weight for any given slack can be obtained from a Gaussian distribution having a mean at the worst negative slack W and a standard deviation given by (slack offset−W)/3. In one embodiment, the slack offset can be a fraction of the fastest clock period in the design or a predetermined number that depends on the process technology used to implement the design. In one embodiment, the function that depends on the delay can be the delay of the net itself or the square root of the delay of the net. In one embodiment, the function that depends on the fanout can be the square root of the fanout f of the net or the expression $(1+\log f)^k$ where k is some positive number (such as 0.5, 1, 2, or 3). In one embodiment, the function that depends on the electrical sensitivity of the net can be the electrical sensitivity itself or the electrical sensitivity raised to some positive power that is greater than 1. In one embodiment, the function that depends on the bounding box size can be half of the perimeter of the smallest rectangle that encloses all the pins of the net (herein referred to as the half-perimeter), or the square root of this half-perimeter. Notably, the above examples are not meant to be an exhaustive list of the functions whose product is used to compute the cost function that can be used to rank the nets, but are merely illustrative of the class of functions that can be used to construct the cost function.

Note that if perfect predictability of net delays and slack were possible, then only nets with negative slack would be of interest (i.e. a net with positive slack already is optimized). However, in light of imperfect predictability, a margin can be created. This margin, which is the slack offset referred to above, ensures that all nets that have slack worse than a small positive value are considered. In one embodiment, this slack offset can be defined as a function of an operating frequency of the design. For example, the slack offset could be T/20, where T is the fastest clock period in the design.

Note that even nets with the same number of pins, bounding-box span, and timing slack may behave very differently in terms of incremental delay and parasitic changes when given sub-optimal routings. Various embodiments may capture this electrical sensitivity of the net to routing mis-predictions as the likelihood of a timing violation on a path passing through the net, a maximum load violation at the driver of the net, or a maximum slew violation at one of its sinks. The ability of an optimization engine to fix these violations can differ from net to net (even for the same magnitude of violation) and therefore can also be factored into the electrical sensitivity metrics in some embodiments. Exemplarily, the electrical sensitivity of a net can be normalized to a number between 0 and 1.

In an embodiment, the net ranking algorithm can be implemented so as to keep the size of the list bounded by the number of nets that will be selected for persistence. In such an implementation, once this list has grown to its eventual predetermined size, a new net will be inserted into the list only if its cost function is better than that of the worst net currently in the list (which will be deleted from the list in the process). This list can be implemented as a priority queue for asymptotically efficient net selection.

A method of performing persistence-driven optimization during physical synthesis can include ranking the nets in a design based on unpredictability and expected quality-of-result impact. In one embodiment, this ranking can include the above-described filtering and ranking. Then, a first predetermined top percentage of the ranked nets can be selected as first persistent nets. Timing-driven global routing can be performed on the first persistent nets. Notably, a timing graph can be back-annotated with actual delays and parasitics determined by performing the timing-driven global routing on the first persistent nets. Synthesis can be run for the nets in the design using the actual delays and the parasitics for the first persistent nets, wherein the synthesis advantageously maintains and updates the routing for the first persistent nets. At this point, the nets in the design can be re-ranked based on unpredictability and expected quality-of-result impact after synthesis. A second predetermined top percentage of the re-ranked nets can be selected as second persistent nets; this set of nets would typically include many of the first persistent nets also.

During subsequent steps, timing-driven global routing can be performed on those second persistent nets that had not been selected earlier among the first persistent nets. Then, global routing can be performed on the remaining nets in the design while maintaining routing for the second persistent nets. This global routing of the remaining nets can be timing-driven. Based on the global routing, a final layout of the optimized design can be output. Note that a computer readable medium comprising computer instructions that, when run on a computer, generate signals to control above-described process steps is also described.

A persistence-driven optimization tool executable by a computer and stored on a computer-readable medium is also described. This tool can include a net selection module, an interconnect-synthesis module, an interconnect-aware circuit optimization module, and a global route translation and preservation module. The net selection module can filter and rank nets in a design based on unpredictability and expected quality-of-result impact, and then output a list of selected nets. The interconnect-synthesis module can perform timing-driven topology generation, layer assignment, and global routing of the selected nets, and then output persistent global routes having actual parasitics and delays for the selected nets. The interconnect-aware circuit optimization module can drive placement-driven optimization based on the actual parasitics and delays for the persistent global routes, and then output an optimized design with the persistent global routes. The global route translation and preservation module can translate the persistent global routes into pre-existing global routes, and then output a design file suitable for global routing and post-route optimization.

DETAILED DESCRIPTION OF THE FIGURES

In 65 nm and subsequent process technologies, the sensitivity of delay and parasitic estimates to changes in the routing is extremely high. Unfortunately, in light of such sensitivity, conventional techniques used by virtual routers can no longer provide accurate results. In accordance with one aspect of improved interconnect-driven physical synthesis, global routes (having accurate parasitic and pin-to-pin delay estimates) created during late-stage placement can be preserved through the subsequent placement-based optimization and the routing stage of the design flow. Notably, this preservation of global routes (called "persistence" herein) can be limited to a very small percentage of the total nets in a design, e.g. 0.5-5%.

Advantageously, this persistence technique can achieve gains in improved predictability due to these persistent routes while minimizing adverse routability of the design. As described below, the nets of a design can be filtered and ranked based on unpredictability and expected quality-of-result impact (sometimes called criticality), thereby significantly limiting the number of such selected nets. As a result, because of the small number of persistent nets, the overall routability impact is quite limited even as the predictability of the design improves significantly.

Figure 1A:
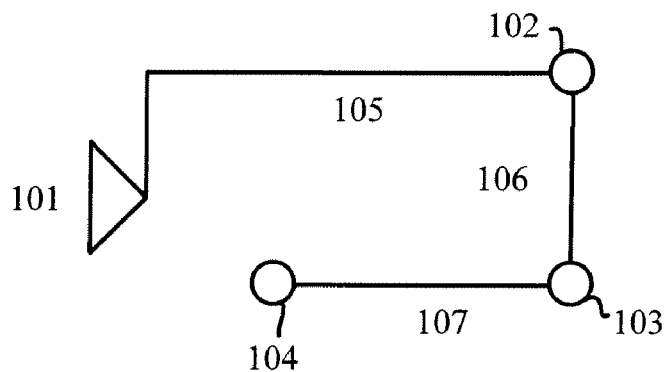
FIGS. 1A-1E illustrate the inaccuracy of using results from a conventional virtual router.
Figure 1B:
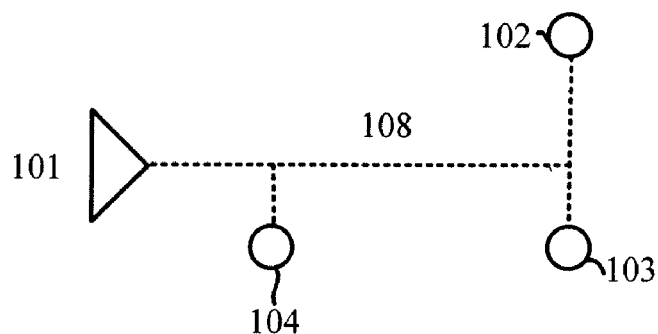
Figure 1C:
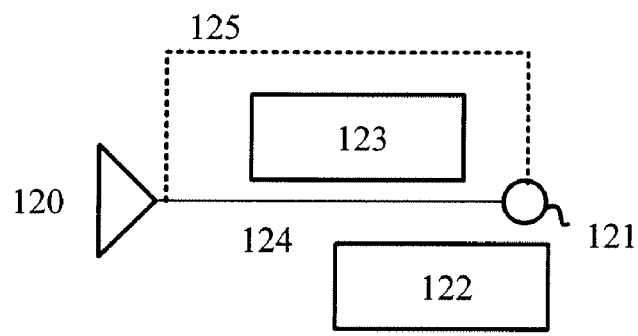
Figure 1D:
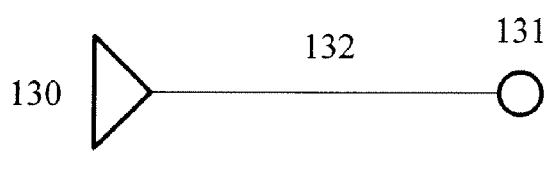
Figure 1E:
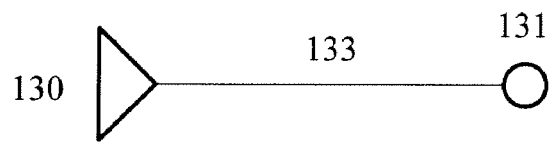
Figure 2:
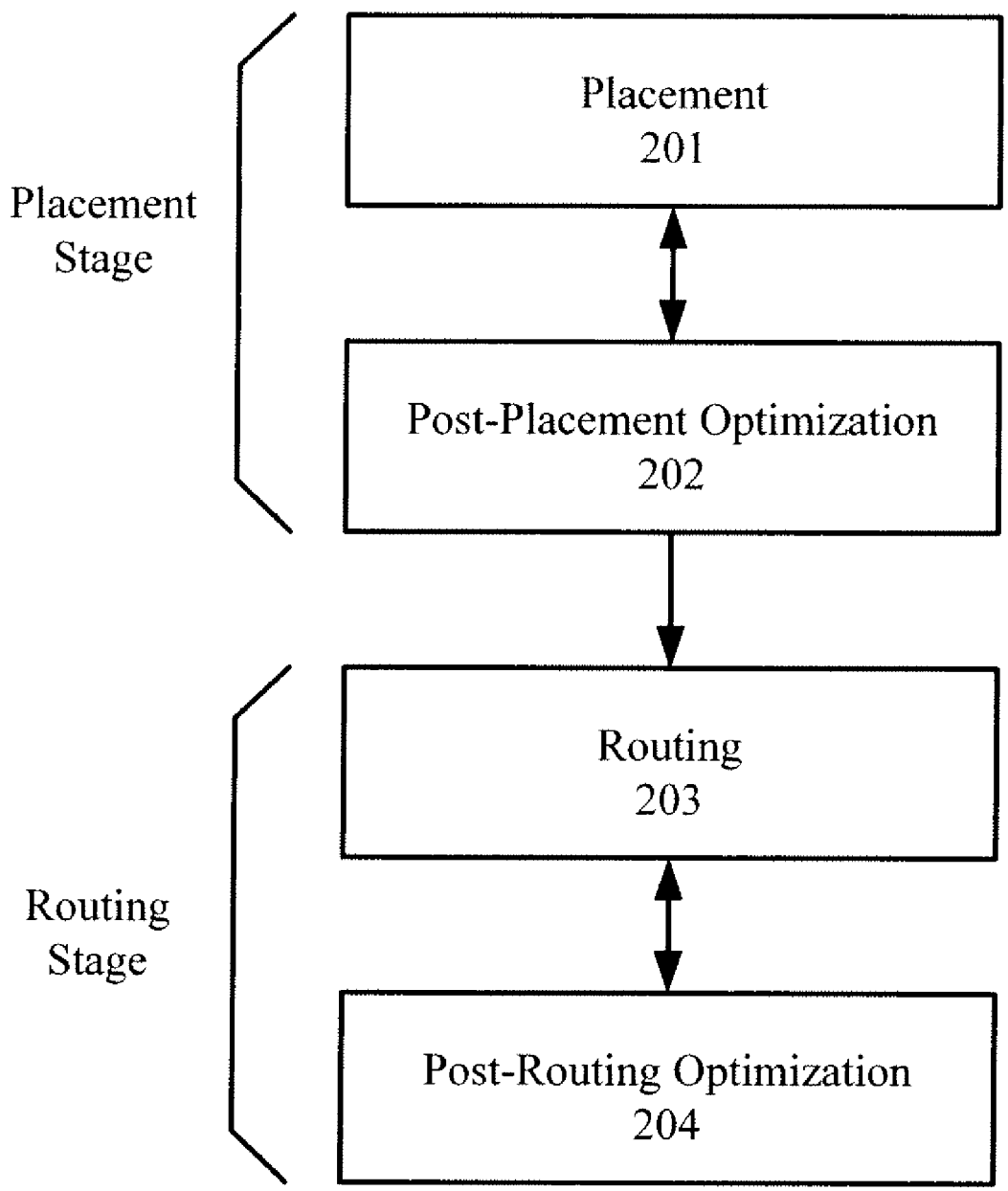
FIG. 2 illustrates a conventional state-of-the-art top-down physical synthesis technique.

To better understand the improvements made possible by persistence, a short description of a conventional synthesis technique is now provided. FIG. 2 illustrates a conventional state-of-the-art physical synthesis technique 200. In technique 200, the design iteratively passes through placement 201 and post-placement optimization 202 (e.g. gate sizing, buffer insertion, and logic restructuring) to generate a detailed, legal placement solution with improved performance. During initial passes through placement 201 and post-placement optimization 202 (called "early-stage" placement), the location of the standard cells (and their pins) in the design can vary significantly as the design is optimized and undergoes placement legalization. These perturbations to the cell/pin locations become smaller during later passes through placement 201 and post-placement optimization 202 (called "late-stage" placement).

During post-placement optimization 202, most of the uncertainty in the interconnect delays is due to a lack of information about the eventual post-routing topology and layer assignments for the nets. Current design flows employ virtual routers to make these predictions, which in turn drive the placement-based optimizations. Unfortunately, these predictions can significantly differ from the eventual routings of the corresponding nets generated by routing 203 and post-routing optimization 204, thereby causing large miscorrelations between the placement and routing stages of the design flow. As a result, significant effort can be wasted on optimizing non-critical nets. Indeed, technique 200 may not be able to identify the actual critical nets leading to subsequent loss in performance of the design.

Notably, placement-based optimization has tremendous potential to extract performance from the design because of the design flexibility in the placement stage. That is, aggressive changes can be made to the design (e.g. buffer insertion, gate sizing, and logic restructuring) that can cause significant physical perturbation, since subsequent incremental placement and legalization can rectify these changes prior to routing 203. Therefore, having high correlation between late-stage placement and post-routing delay and parasitic prediction can drive the optimization trajectory for maximum performance gains.

In contrast, although the post-routing optimization 204 has accurate information about the design parasitics, the routing for the nets does not allow large perturbations in the design in order to maintain the validity of the routings. As a result, there is a very restricted number of optimizations available (e.g. minimal buffer insertion, gate sizing, layer shifting, and some rerouting) that the designer can use during routing 203 and post-routing optimization 204.

Being able to guarantee correlation using persistent nets can advantageously drive the placement-based optimization steps to extract large performance gains. In accordance with interconnect-driven physical synthesis using persistent virtual routing, the correlation between the delay and parasitic estimates in the placement and routing stages of the design flow can be advantageously enforced. As described in further detail below, persistent virtual routing can drive effective optimization during the late-stage placement on critical, unpredictable nets while avoiding any wasted optimization effort on non-critical or predictable nets.

In general, to achieve this optimization, global routes for selected candidate nets can be generated during late-stage placement. These global routes can be used to estimate the interconnect parasitics and delay estimates (which are used to drive subsequent post-placement optimization). Notably, these routings can be made persistent by preserving them through the subsequent global routing phase.

Figure 3:
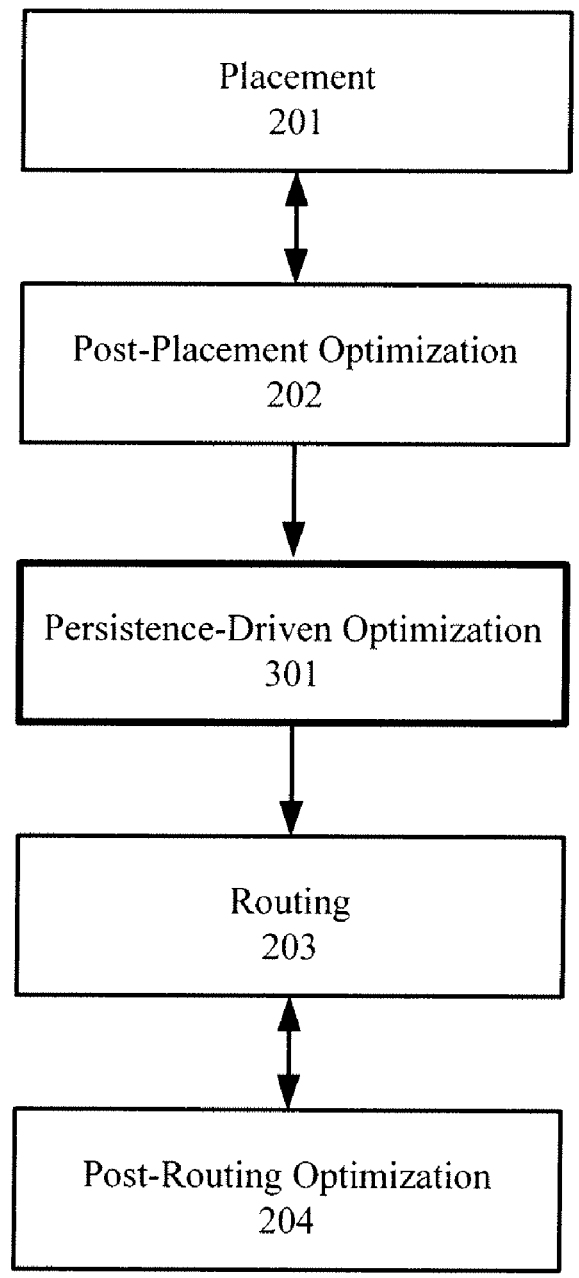
FIG. 3 illustrates an interconnect-driven physical synthesis technique using persistent virtual routing.

FIG. 3 illustrates an interconnect-driven physical synthesis technique using persistent virtual routing 300. In technique 300, persistence-driven optimization 301 can be invoked during late-stage placement when the placement has stabilized (note that placement 201, post-placement optimization 202, routing 203, and post-routing optimization 204 are described in reference to FIG. 2). As previously indicated, subsequent optimization can indeed cause small perturbations to the pin locations as a result of cell sizing, buffer insertion, or other transforms. However, technique 300 has the capability to handle many of these changes through the patching of the persistent global routes.

Figure 4:
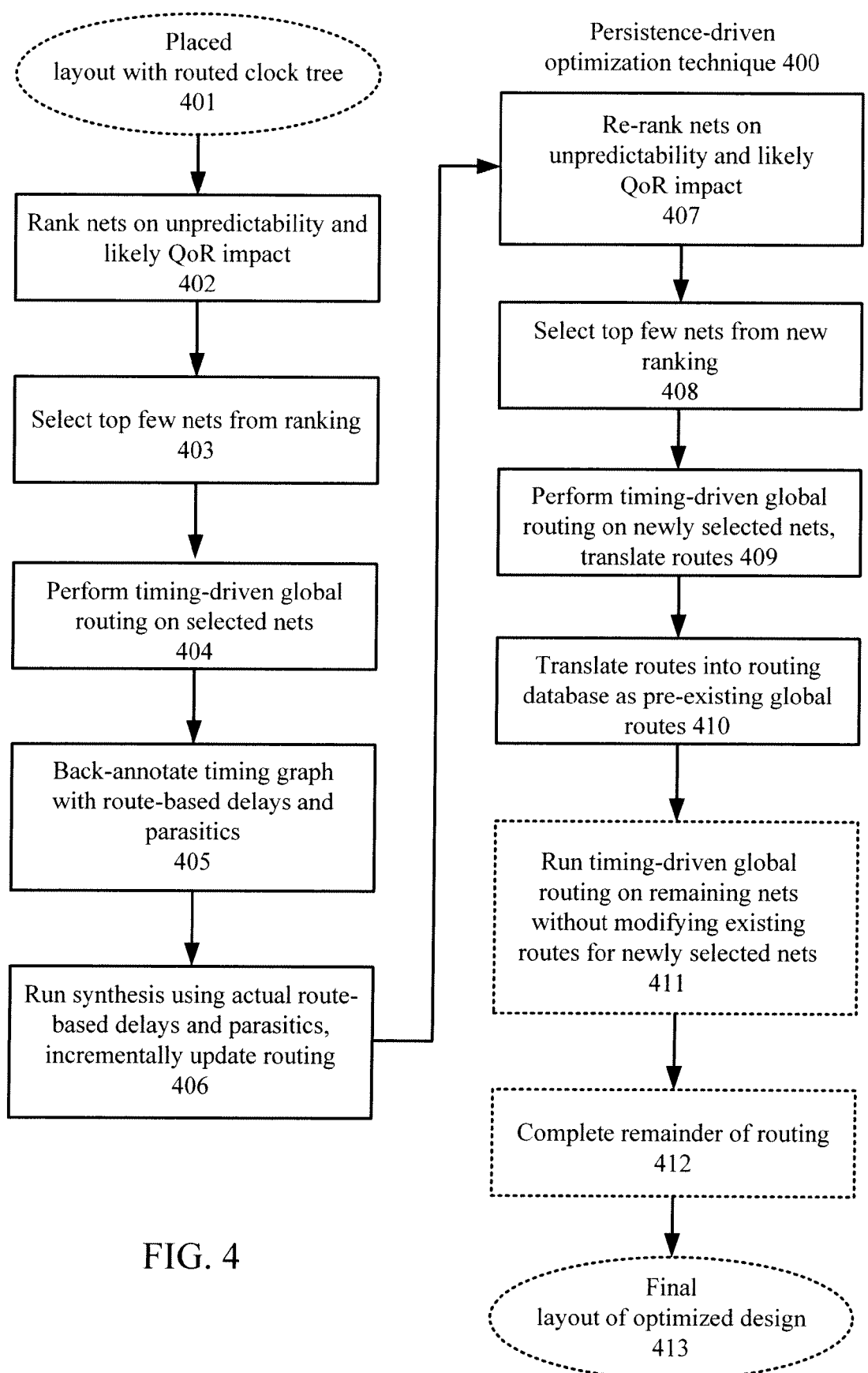
FIG. 4 illustrates a persistence-driven optimization technique.

FIG. 4 illustrates an exemplary persistence-driven optimization technique 400. To eliminate the uncertainty that can exist on the timing paths due to virtual clocks, a clock tree 401 can be synthesized, optimized, and routed prior to invoking persistence-driven optimization technique 400. In technique 400, step 402 can rank the nets in the design based on their likely timing/electrical criticality (also called quality-of-result or QoR) impact and likely unpredictability.

Notably, as empirically demonstrated, the number of nets that (1) have significant delays of their own and (2) are on critical paths (the nets associated with QoR impact) is usually relatively small (e.g. less than 20% of the total nets). The unpredictability condition can be met by any net whose delay mis-prediction can have a significant impact (e.g. over 10% difference in the delay of the most critical path passing through that net). Of interest, many of the critical nets are also predictable. That is, any reasonable optimization engine can isolate non-critical sinks through buffer insertion, and a timing-driven router can route them preferentially. Thus, using the QoR impact and the unpredictability criteria can initially form a small list in step 402 (e.g. less than 10% of the total nets), which can be ranked quickly.

The ranking generated in step 402 can be used to choose the candidate nets that are to be made persistent in step 403. In one embodiment, the percentage of nets selected can be 0.5-5% of the total nets in the design (wherein a typical IC design can have 500,000 to several million total nets). In another embodiment in which only a block from the design is being synthesized, the percentage of nets selected can be 3-5% of the total nets in the block (wherein a typical IC block can have 50,000 to 500,000 nets).

Notably, the selected nets are not always associated with the most critical nets exclusively. Indeed, the selected nets often tend to be the nets that are on the verge of being characterized as being critical, i.e. the near-critical nets. This observation can be explained (albeit in hindsight) by appreciating that good routing for near-critical nets (as is usually assumed by virtual routers) can advantageously keep such nets from being critical paths. However, bad routing for near-critical nets (as may be actually generated by the global router) can make such nets critical. As explained in further detail in reference to FIG. 6, the selection of nets can be based on timing-slack-based criticality, pin-to-pin delays, the number of fan-out pins, and/or bounding-box-based physical span.

Step 404 can then perform congestion-aware, timing-driven global routes for the selected nets. These persistent global routes can be used to estimate the pin-to-pin delays and parasitics for the selected nets. Step 405 can then back-annotate a timing graph with these delays and parasitics. Step 406 can invoke placement-based optimizations that are driven by the parasitics seen from the persistent nets. That is, synthesis can be run using the route-based delays and parasitics. Note that the persistent nets are treated preferentially during synthesis to maintain the validity of their global routes. Furthermore, a persistent routing that changes during synthesis can often be incrementally updated.

At this point, step 407 can re-rank all the nets based on unpredictability and likely QoR impact. Step 408 selects the top few nets from the new ranking generated in step 407. Note that some nets selected in step 403 may be eliminated from this revised list, while some new nets may appear on the list as being critical and unpredictable based on the current status of the design. In one embodiment, each net newly selected in step 408 can be compared to the nets already on the list of selected nets (generated in step 403), thereby maintaining a list of predetermined size.

In one embodiment, the percentage of nets selected in step 403 (e.g. 5-6%) can be larger than the percentage of nets selected in step 408 (e.g. 3%). In this manner, 70-90% of the originally selected nets may survive this refresh cycle. Advantageously, keeping a larger list during steps 404-408 has very little penalty during the synthesis stage (unlike the routing stage).

The surviving persistent nets can retain their original global routings while new global routes can be generated for the newly added persistent nets in step 409. By actively controlling the global routes of these critical, unpredictable nets, the global router is prevented from accidentally generating poor routes for these nets. These global routes can be translated into pre-existing global routes in step 410, thereby enforcing persistence in the net database.

The global routing engine can then be invoked to complete global routing for the remaining nets while treating the persistent global routings preferentially (by not considering them as candidates for rip-up-and-reroute) in step 411. In one embodiment, this global routing of the remaining nets can be timing-driven. Step 412 can perform post-routing optimization and then output a final layout 413 of the design. Note that steps 411 and 412 can be characterized as part of routing and post-routing optimization stages, but are shown in FIG. 4 for context.

Figure 5A:
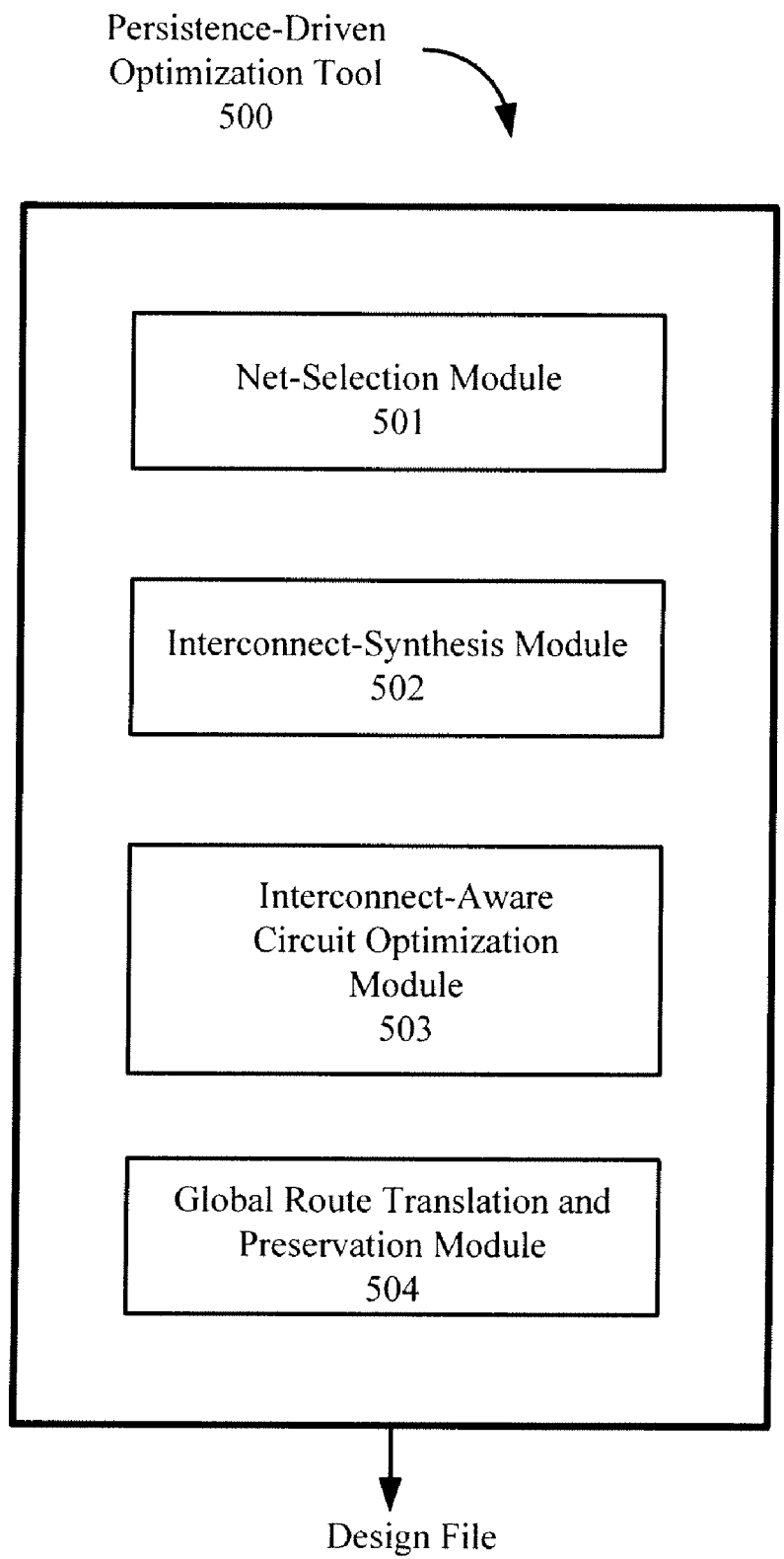
FIG. 5A illustrates a persistence-driven optimization tool.

FIG. 5A illustrates an exemplary persistence-driven optimization tool 500 that can enable steps 402-411. In one embodiment, the exemplary modules of tool 500 can include a net-selection module 501, an interconnect-synthesis module 502, an interconnect-aware circuit optimization module 503, and a global route translation and preservation module 504. Note that other embodiments of tool 500 can include fewer or more modules, i.e. the functionality is divided between modules 501-504 for simplicity and does not necessarily describe actual software modules.

Net selection module 501 can be used to predict the most critical, unpredictable nets in the design. In one embodiment, a small number (e.g. less than 5%) of nets under the persistence paradigm can be selected, thereby minimizing any worsening of the routability of the design. Net selection module 501 can perform an efficient ranking of the nets in terms of their likelihood of becoming critical through various cost metrics that capture unpredictability and criticality. In one embodiment, cost functions including one or more metrics, e.g. timing slack based criticality, pin-to-pin delays, number of fan-out pins, electrical sensitivity, and bounding-box based physical span can be used. In one embodiment, net selection module 501 can perform steps 402, 403, 407, and 408 (FIG. 4).

Interconnect-synthesis module 502 can perform the timing-driven topology generation, layer assignment, and global routing of the selected nets. Because the persistent nets are often critical or near-critical, high-quality timing-driven routes can be generated for these nets. However, as pointed out earlier, the routability of the remaining (i.e. non-persistent) nets in the design can remain substantially unaffected. Advantageously, selecting only a small fraction of nets to be made persistent can significantly minimize such routability issues.

Additionally, to further minimize routability issues, interconnect synthesis module 502 can explicitly consider congestion while generating timing-driven routes for the persistent nets, thereby not worsening the complexity of the subsequent global routing phase of the design flow. The interconnect synthesis module 502 can heuristically minimize the expected congestion. In one embodiment, interconnect synthesis module 502 can reserve a certain fraction of the routing resources in every region for the non-persistent nets to improve congestion. In another embodiment, the fraction of routing resources reserved in each global routing cell (also referred to as gcell) for subsequent global routing can be proportional to some non-decreasing function of its expected demand, where the demand has been estimated from the congestion map. Note that congestion maps for module 502 can be obtained using a fast global router or through probabilistic techniques.

Preferably, interconnect-synthesis module 502 can use techniques to avoid significant computation overhead. For example, in one embodiment, interconnect-synthesis module 502 can use a single net router that generates a layer-aware Steiner topology for the net in a timing-driven and/or congestion-driven manner and then routes each of its Steiner segments using a hybrid point-to-point router that combines maze-routing with line-probe routing to obtain a good tradeoff between runtime and route quality.

Figure 5B:
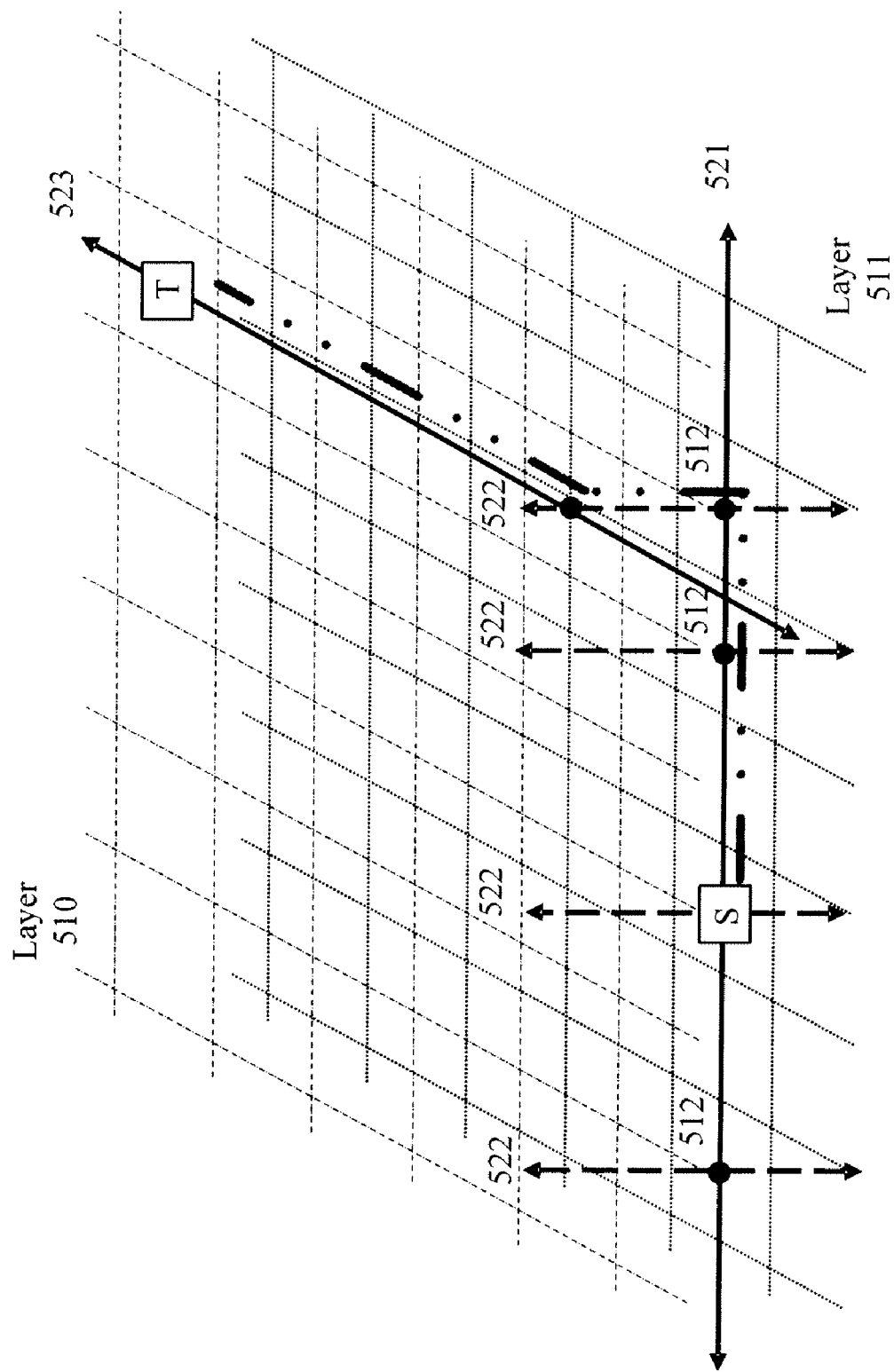
FIG. 5B illustrates an exemplary routing performed by a hybrid point-to-point router.

The point-to-point router can combine the high solution quality that can be obtained using a maze-router with the runtime efficiency of a line-probe router. FIG. 5B illustrates an exemplary routing performed by a hybrid point-to-point router. A hybrid point-to-point router can iteratively generate line probes in all possible routing directions on permissible layers (e.g. the layers including dashed-dotted line routing grids 510 and 511) as well as along vias (which can be envisioned as vertical lines between the layers) from a source point S and then use heuristics to generate multiple escape points 512 for further exploration in order to reach a target point T.

For example, in FIG. 5B, line probes 521 can be formed that intersect the source point S and follow a line on routing grid 510 (i.e. bi-directional probe lines). Then, escape points 512 can be generated along line probes 521. Notably, each escape point 512 can be associated with a cumulative cost which can be computed as a combination of the congestion cost as well as the timing cost (computed as a function of the expected delay along the path from source point to the current point). The density and location of escape points 512 can be determined using various heuristics (e.g. using a greedy bias towards the direction of the final target, or by preferring probes with lower cost). Thus, the generation of escape points is advantageously non-exhaustive, thereby minimizing computation resources.

Each escape point 512 can serve as a source for the next set of line probes, which in FIG. 5B are line probes 522. Line probes 522 are perpendicular to the layers including routing grids 510 and 511 and thus can be considered potential vias between these layers. Line probes 523 can be formed that interest the target point T and follow a line on routing grid 511. In one embodiment, these bi-directional line probes 523 can be formed before, substantially at the same time, or after bi-direction line probes 521. Escape points can be formed on line probes 523 in a similar manner to that described above for line probes 521 (only one shown for simplicity).

Thus, this process of iteratively generating line probes and using escape points on these line probes for further exploration can be used to complete the path between source point S and target point T. The final solution can be chosen as the lowest cost path found between the source and the target points. One can run the hybrid point-to-point router from both the source point S and the destination point T; any intersection of line probes originating from the source point S and the destination point T is a valid routing solution for the point-to-point hybrid router.

In another embodiment, the interconnect synthesis module can employ the interconnect synthesis engine described above to generate the persistent global routes for the most critical nets (e.g. 0.5-1% of all nets) and use the global router in a timing-driven mode to generate routes for the remaining 5-5.5% of the nets selected for persistence. In yet another embodiment, the interconnect synthesis module 502 can use the global router in a timing-driven mode to generate routes for up to 5-6% of the nets without relying on the interconnect synthesis engine referred to above, thereby resulting in a persistent net selection and route generation runtime that is relatively independent of the number of nets selected.

In one embodiment, the last-selected persistent routings can be retained through the remainder of the synthesis flow using lightweight data structures to represent the routing trees. As indicated previously, the parasitics and delays for the persistent nets can be computed using these routings and the timing graphs can be updated appropriately to drive future optimization.

Note that the proposed persistent flow is independent of the actual routing algorithm that is used for interconnect synthesis. In one embodiment, interconnect-synthesis module 502 can perform steps 404 and 409 (FIG. 4).

Interconnect-aware circuit optimization module 503 can drive placement-driven optimization based on the parasitics and delays for the persistent global routes back-annotated into the timing graph. The optimization can be performed using parasitic and delay values generated by the virtual router for all other (i.e., non-persistent) nets. In one embodiment, interconnect-aware circuit optimization module 503 can rely on the use of the same engines for the parasitic extraction and the delay calculation for both the persistent and the non-persistent routes to avoid calibration errors.

Advantageously, the improved accuracy of the parasitics allows more accurate identification of the critical, unpredictable nets, thereby driving the optimization trajectory more effectively. Getting accurate estimates about the criticality of a given net, in turn, can reduce the possibility of insufficient or excessive optimization of that net. As noted previously, even persistent nets that are not currently critical, may become critical if routed poorly due to their high sensitivity. Thus, making such potentially critical nets persistent prevents them from becoming critical during the later stages of the synthesis flow.

Note that commonly used optimization techniques, such as cell sizing and buffer insertion, can cause changes to the pin locations and even interconnect topologies, thereby potentially rendering the persistent routings invalid. Therefore, interconnect-aware circuit optimization module 503 can implement several algorithms to treat persistent nets preferentially so that cell sizing and buffer insertion maintains the validity of the persistent global routes as much as possible. This preferential treatment can include incrementally patching the global routes at the pin locations subsequent to cell sizing as well as global route inheritance from persistent nets that are split into multiple nets after buffer insertion. More precisely, the routes for the new nets obtained after one or more buffers have been inserted into a persistent net can be derived from the route for the original net. In one embodiment, the pre-routing stage buffer insertion algorithms can be modified to make them aware of the global routes for persistent nets while deciding the topological and geometric location of a new buffer. This modification allows the recovery of a substantial portion of the persistent routing for the newly formed nets from the routes of the original persistent nets (and thus, the use of accurate parasitics for these new nets). Note that some of the most invasive optimization techniques may not allow derivation of the routing of the resulting nets. In such cases, the default virtual router can be used for those nets. In one embodiment, interconnect-aware circuit optimization module 503 can perform steps 405 and 406 (FIG. 4).

Global route translation and preservation module 504 advantageously preserves the persistence property of the synthesis flow. After first translating the routes for the persistent nets into actual global routes in the database, module 504 can enable the global routing engine to respect these routes as pre-existing global routes while completing global routing for the remaining (non-persistent) nets in the design. Note that the routing resources used by the persistent global routes are not available to the global routing engine during rip-up-and-reroute. In one embodiment, there is no special protection for the persistent nets during detailed routing or the subsequent post-routing circuit optimization steps (and their associated incremental re-routings), in order to avoid any limitations on the effectiveness of these steps. In one embodiment, global route translation and preservation module 504 can perform steps 410 and 411 (FIG. 4). In summary, by using modules 501-504, persistence-driven optimization tool 500 can advantageously balance the accuracy of parasitics and routability.

Note that the above-described modules can be implemented in a high-level procedural or object-oriented programming language, or in assembly or machine language if desired. In any case, the language can be a compiled or interpreted language. Suitable processors include, for example, both general and special purpose microprocessors, as well as other types of micro-controllers. Generally, a processor can receive instructions and data from a read-only memory (ROM) and/or a random access memory (RAM). Generally, a computer can include one or more mass storage devices for storing data files. Exemplary mass storage devices include magnetic disks (such as internal hard disks and removable disks), magneto-optical disks, and optical disks. Storage devices suitable for tangibly embodying computer program instructions and data include all forms of non-volatile memory, including by way of example semiconductor memory devices (such as EPROM, EEPROM, and flash memory devices), magnetic disks (such as internal hard disks and removable disks), magneto-optical disks, and CDROM disks. Any of the foregoing can be supplemented by, or incorporated in, application-specific integrated circuits (ASICs).

Figure 6:
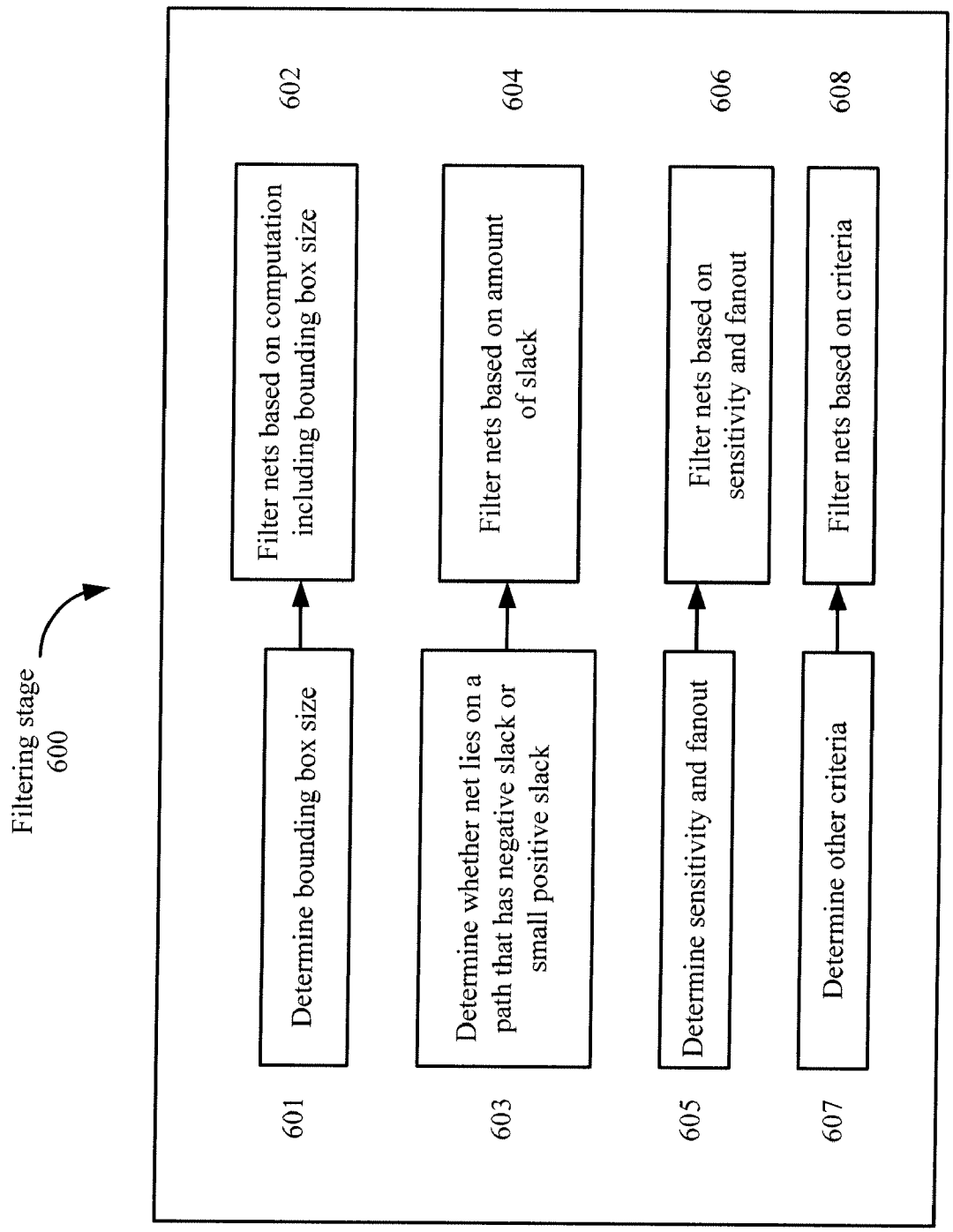
FIG. 6 illustrates an exemplary filtering stage.

FIG. 6 illustrates an exemplary filtering stage 600 that can be used during the step of ranking nets (402, FIG. 4). In general, steps 601, 603, 605, and 607 can determine values based on predetermined criteria, whereas steps 602, 604, 606, and 608 can filter the nets based on the values determined in steps 601, 603, 605, and 607, respectively. Note that steps 601, 603, 605, and 607 can be performed in any order; in contrast, steps 602, 604, 606, and 608 can be performed at any time after steps 601, 603, 605, and 607, respectively. In one embodiment, steps 601/602, 603/604, and 605/607 can be performed, although in other embodiments, fewer or more steps can be performed. As explained in further detail, steps 601/602, 603/604, and 605/606 can be characterized as filtering out nets that have small physical span, have only one fanout as well as low electrical sensitivity, or do not lie on critical or near-critical paths.

In accordance with one embodiment of a filtering technique, step 601 can determine a size of a bounding box associated with a net. The bounding box is the smallest rectangle that includes all the pins of the net. The size of that bounding box can be determined by subtracting the minimum x coordinate from the maximum x coordinate to generate the x length, subtracting the minimum y coordinate from the maximum y coordinate to generate the y length, and then summing the x and y lengths and multiplying by 2.

The computed bounding box value can then be compared to a threshold value, e.g. the 3 times the average bounding box of a global routing cell (i.e. a gcell) in the design. Note that the size of a gcell is usually known a priori, and depends on the router used in the design flow and the cell library used by the design. If the computed bounding box value is less than the threshold value, then that net can be ignored. On the other hand, if the computed bounding box value is equal to or greater than the threshold value, then the net can be included in the list. In one embodiment, steps 601 and 602 can typically filter out at least 70% of the nets in the design.

Note that steps 601 and 602 address the physical span of the net. Consider that if the physical span of the net is very small, then the likelihood of the net having a large delay is very small. Thus, the physical span of the net (e.g. as measured by the bounding box) can provide information regarding the delay associated with that net. Typically, a mis-prediction of a net having a short delay only minimally affects synthesis. That is, the contribution of that net to the delay of the most critical path on which it lies is minimal. Therefore, a virtual router can provide a delay for a short net with only a small absolute error, but is less successful at doing so for a longer net.

In accordance with another embodiment of a filtering technique, step 603 can determine whether a net lies on a path that has negative slack or a small positive slack. As used herein, the slack of a net can be defined as the timing slack of the most critical path passing through that net. Consider that if all paths through a net have large positive slacks, then that net is probably not critical. Thus, step 604 can ignore nets that have medium to large positive slack. In one embodiment, the threshold set to distinguish "small" and "medium" positive slack is +T/20, wherein T is the period of the fastest clock in the design.

In accordance with another embodiment of a filtering technique, step 605 can determine the electrical sensitivity and a fanout associated with a net. Sensitivity is an electrical concept that captures the likelihood of a net becoming timing critical or having an electrical DRC (design rule check) violation, e.g. maximum slew or maximum capacitive load violation. As the length of the net increases, so does its delay. Additionally, as the length of the net increases, the transition times of a signal at the sinks of the net (i.e. the slews) and the capacitive load driven by the driver of the net increase. For a given driver of the net, there is a maximum slew it can support as well as a maximum capacitive load that it can drive without DRC violation. In one embodiment to measure sensitivity, one can estimate the maximum increase in the length of a net that will cause the net to become timing-critical, or the total capacitance of the net and its sink pins becomes greater than the maximum permissible capacitance for the driver of that net, or the slew at some sink pin becomes worse than the worst permissible slew. This permissible wirelength increase can then be normalized and aggregated across various path endpoints and clock domains, and then re-normalized to yield a number between 0 and 1. The nets can be ordered based on this electrical sensitivity metric. Higher normalized values indicate higher sensitivity.

Generally, increasing the number of sink pins of a net (i.e. increasing its fanout) can result in greater unpredictability. That is, the greater the fanout, the more choices for topology, which increases unpredictability. Notably, a good synthesis algorithm can insert buffers into clearly critical paths to isolate their non-critical sink pins from their net driver. Therefore, the most critical paths tend not to have large fanouts. In one embodiment, step 606 can be limited to omit 2-pin (i.e. one sink pin) nets that are not very sensitive. In other words, only those 2-pin nets that are above a threshold of sensitivity are included in the list, in addition to including all nets that have three or more pins. In one embodiment, the threshold for electrical sensitivity for such 2-pin nets is 0.85.

In accordance with another embodiment of a filtering technique, step 607 can determine other criteria associated with each net. An exemplary criterion could be whether a net is part of a bus in the design. In one embodiment, if the net is part of a bus, then that net is ignored, so that it may be routed by a specialized bus router if possible. Other criteria could include nets that drive or are driven by the input/output pins of the design. The nets that pass the above filters can then be ranked using cost functions.

Figure 7:
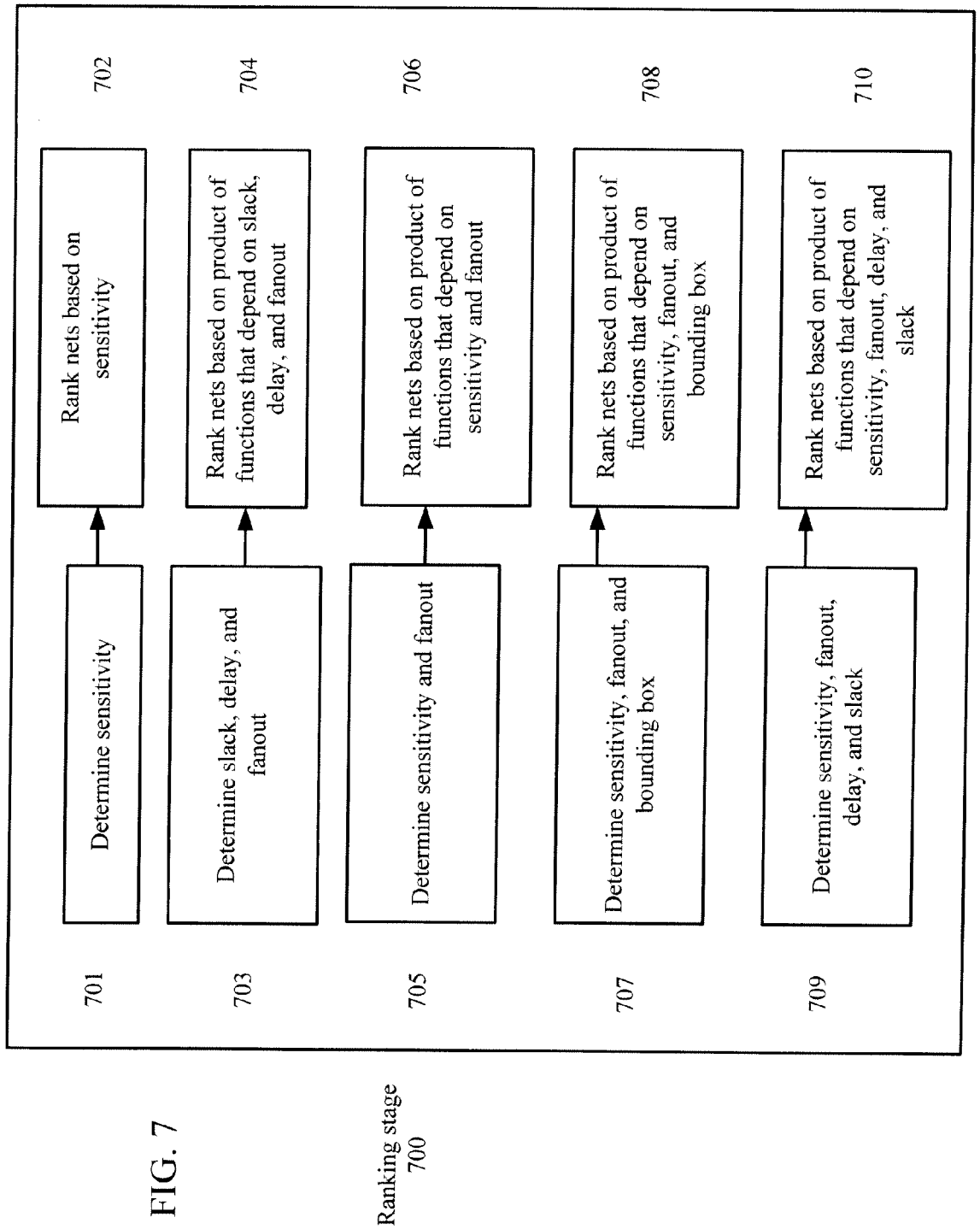
FIG. 7 illustrates an exemplary ranking stage.

FIG. 7 illustrates an exemplary ranking stage 700 that can be used during the step of selecting the top few nets (403, FIG. 4) for persistence. In general, steps 701, 703, 705, and 707 can determine the values of the metrics associated with the cost functions for the filtered nets, whereas steps 702, 704, 706, and 708 can use the values determined in steps 701, 703, 705, and 707 respectively, to rank those filtered nets. In one embodiment, steps 701/702, 703/704, 705/706, and 707/708 can be performed independently of one another, i.e. only one cost function is used for net ranking. In another embodiment, multiple cost functions can be used for net ranking with each cost function being given a weight.

In accordance with one embodiment of a net ranking technique, step 701 can determine the sensitivity of each of the filtered nets and step 702 can rank the nets based on the electrical sensitivity of the nets.

In another embodiment, step 703 can determine the slack, delay, and fanout of each of the filtered nets and step 704 can rank the nets based on a product of functions that depend on slack, delay, and fanout. The slack function can be the timing slack of the net augmented by a predetermined margin (referred to as the slack offset) or a product of this augmented slack with a slack weight. The slack weight for any given slack can be obtained from a Gaussian distribution having a mean at the worst negative slack W and a standard deviation given by (slack offset−W)/3. The slack offset can be a fraction of the fastest clock period in the design or a predetermined number that depends on the process technology used to implement the design. The delay function can be the delay of the net itself or the square root of the delay of the net. The fanout function can be the square root of the fanout f of the net or the expression $(1+\log f)^k$ where k is some positive number (such as 0.5, 1, 2, or 3).

In yet another embodiment, step 705 can determine the sensitivity and fanout of each of the filtered nets and step 706 can rank the nets based on a product of functions that depend on sensitivity and fanout. The electrical sensitivity function of the net can be the electrical sensitivity itself or the electrical sensitivity raised to some positive power that is greater than or equal to 1. The fanout function can be the square root of the fanout f of the net or the expression $(1+\log f)^k$ where k is some positive number (such as 0.5, 1, 2, or 3).

In yet another embodiment, step 707 can determine the sensitivity, fanout, and bounding box size of each of the filtered nets and step 708 can rank the nets based on a product of functions that depend on sensitivity, fanout, and bounding box. The electrical sensitivity function of the net can be the electrical sensitivity itself or the electrical sensitivity raised to some positive power that is greater than or equal to 1. The fanout function can be the square root of the fanout f of the net or the expression $(1+\log f)^k$ where k is some positive number (such as 0.5, 1, 2, or 3). The bounding box function can be the half of the perimeter of the smallest rectangle that encloses all the pins of the net (herein referred to as the half-perimeter), or the square root of this half-perimeter.

In yet another embodiment, step 709 can determine the sensitivity, fanout, delay, and slack of each of the filtered nets and step 710 can rank the nets based on a product of functions that depend on sensitivity, fanout, delay, and slack. The electrical sensitivity function of the net can be the electrical sensitivity itself or the electrical sensitivity raised to some positive power that is greater than or equal to 1. The fanout function can be the square root of the fanout f of the net or the expression $(1+\log f)^k$ where k is some positive number (such as 0.5, 1, 2, or 3). The delay function can be the delay of the net itself or the square root of the delay of the net. The slack function can be the timing slack of the net augmented by a predetermined margin (referred to as the slack offset) or a product of this augmented slack with a slack weight. The slack weight for any given slack can be obtained from a Gaussian distribution having a mean at the worst negative slack W and a standard deviation given by (slack offset−W)/3. The slack offset can be a fraction of the fastest clock period in the design or a predetermined number that depends on the process technology used to implement the design.

Notably, the above examples are not meant to be an exhaustive list of the functions whose product is used to compute the cost function that can be used to rank the nets, but are merely illustrative of the class of functions that can be used to construct the cost function.

Note that if perfect predictability of net delays and slack were possible, then only nets with negative slack would be of interest (i.e. a net with positive slack already is optimized). However, in light of imperfect predictability, a margin can be created. This margin, which is the slack offset referred to above, ensures that all nets that have slack worse than a small positive value are considered. In one embodiment, this slack offset can be defined as a function of an operating frequency of the design. For example, the slack offset could be T/20, where T is the fastest clock period in the design.

Note that even nets with the same number of pins, bounding-box span, and timing slack may behave very differently in terms of incremental delay and parasitic changes when given sub-optimal routings. Various embodiments may capture this electrical sensitivity of the net to routing mis-predictions as the likelihood of a timing violation on a path passing through the net, a maximum load violation at the driver of the net, or a maximum slew violation at one of its sinks. The ability of an optimization engine to fix these violations can differ from net to net (even for the same magnitude of violation) and therefore can also be factored into the electrical sensitivity metrics in some embodiments. Exemplarily, the electrical sensitivity of a net can be normalized to a number between 0 and 1.

In an embodiment, the net ranking algorithm can be implemented so as to keep the size of the list bounded by the number of nets that will be selected for persistence. In such an implementation, once this list has grown to its eventual predetermined size, a new net will be inserted into it only if its cost function is better than that of the worst net currently in the list (which will be deleted from the list in the process). This list can be implemented as a priority queue for asymptotically efficient net selection.

Figure 8:
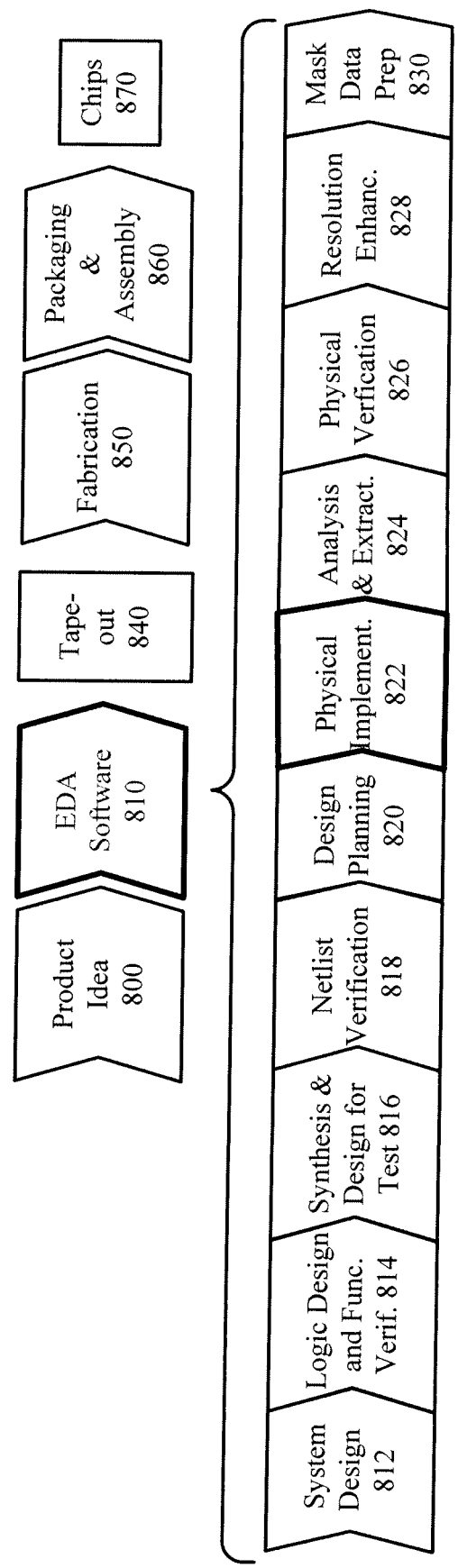
FIG. 8 illustrates a simplified representation of an exemplary digital ASIC design flow in which persistence in interconnect-driven physical synthesis can be performed.

FIG. 8 shows a simplified representation of an exemplary digital ASIC design flow in which persistence in interconnect-driven physical synthesis can be performed. At a high level, the process starts with the product idea (step 800) and is realized in an EDA software design process (step 810). When the design is finalized, it can be taped-out (event 840). After tape out, the fabrication process (step 850) and packaging and assembly processes (step 860) occur resulting, ultimately, in finished chips (result 870).

The EDA software design process (step 810) is actually composed of a number of steps 812-830, shown in linear fashion for simplicity. In an actual ASIC design process, the particular design might have to go back through steps until certain tests are passed. Similarly, in any actual design process, these steps may occur in different orders and combinations. This description is therefore provided by way of context and general explanation rather than as a specific, or recommended, design flow for a particular ASIC.

A brief description of the components steps of the EDA software design process (step 810) will now be provided:

System design (step 812): The designers describe the functionality that they want to implement, they can perform what-if planning to refine functionality, check costs, etc. Hardware-software architecture partitioning can occur at this stage. Exemplary EDA software products from Synopsys, Inc. that can be used at this step include Model Architect, Saber, System Studio, and DesignWare® products.

Logic design and functional verification (step 814): At this stage, the VHDL or Verilog code for modules in the system is written and the design is checked for functional accuracy. More specifically, the design is checked to ensure that it produces the correct outputs. Exemplary EDA software products from Synopsys, Inc. that can be used at this step include VCS, VERA, DesignWare®, Magellan, Formality, ESP and LEDA products.

Synthesis and design for test (step 816): Here, the VHDL/Verilog is translated to a netlist. The netlist can be optimized for the target technology. Additionally, the design and implementation of tests to permit checking of the finished chip occurs. Exemplary EDA software products from Synopsys, Inc. that can be used at this step include Design Compiler®, Physical Compiler, Test Compiler, Power Compiler, FPGA Compiler, Tetramax, and DesignWare® products.

Netlist verification (step 818): At this step, the netlist is checked for compliance with timing constraints and for correspondence with the VHDL/Verilog source code. Exemplary EDA software products from Synopsys, Inc. that can be used at this step include Formality, PrimeTime, and VCS products.

Design planning (step 820): Here, an overall floorplan for the chip is constructed and analyzed for timing and top-level routing. Exemplary EDA software products from Synopsys, Inc. that can be used at this step include Astro and IC Compiler products.

Physical implementation (step 822): The placement (positioning of circuit elements) and routing (connection of the same) occurs at this step. Exemplary EDA software products from Synopsys, Inc. that can be used at this step include the Astro and IC Compiler products. The above-described interconnect-driven physical synthesis using persistent virtual routing can be used in step 822. As indicated above, any congestion-aware performance-driven interconnect synthesis engine can be used for the initial routing of the selected nets. This process typically yields higher quality routes for these critical, unpredictable nets than would be possible using the global router (and, given the small number of such nets that are selected, the computation overhead is quite small). Moreover, our approach guarantees that the parasitics used for the optimization of most of the critical, unpredictable nets are based on actual routes (and not merely on likely topologies that may or may not be instantiated).

Analysis and extraction (step 824): At this step, the circuit function is verified at a transistor level, this in turn permits what-if refinement. Exemplary EDA software products from Synopsys, Inc. that can be used at this step include AstroRail, PrimeRail, Primetime, and Star RC/XT products.

Physical verification (step 826): At this step various checking functions are performed to ensure correctness for: manufacturing, electrical issues, lithographic issues, and circuitry. Exemplary EDA software products from Synopsys, Inc. that can be used at this step include the Hercules product.

Resolution enhancement (step 828): This step involves geometric manipulations of the layout to improve manufacturability of the design. Exemplary EDA software products from Synopsys, Inc. that can be used at this step include Proteus, ProteusAF, and PSMGen products.

Mask data preparation (step 830): This step provides the "tape-out" data for production of masks for lithographic use to produce finished chips. Exemplary EDA software products from Synopsys, Inc. that can be used at this step include the CATS(R) family of products.

Although illustrative embodiments of the invention have been described in detail herein with reference to the accompanying figures, it is to be understood that the invention is not limited to those precise embodiments. They are not intended to be exhaustive or to limit the invention to the precise forms disclosed. As such, many modifications and variations will be apparent to practitioners skilled in this art. Accordingly, it is intended that the scope of the invention be defined by the following claims and their equivalents.

The invention claimed is:

1. A method of performing physical synthesis using persistence-driven optimization, the method comprising:
using a processor,
ranking nets in a design based on unpredictability and expected quality-of-result impact;
selecting a first predetermined top percentage of the ranked nets as first persistent nets;
performing timing-driven global routing on the first persistent nets;
back-annotating a timing graph with actual delays and parasitics determined by performing the timing-driven global routing on the first persistent nets;

running synthesis for the nets in the design using the actual delays and the parasitics for the first persistent nets, wherein the synthesis maintains and updates routing for the first persistent nets;

re-ranking the nets in the design after synthesis based on unpredictability and expected quality-of-result impact;

selecting a second predetermined top percentage of the re-ranked nets as second persistent nets;

performing timing-driven global routing on the second persistent nets that had not been selected among the first persistent nets;

performing global routing on the nets of the design while maintaining existing routes of the second persistent nets; and outputting a final layout of the design based on the global routing.

2. The method of claim 1, wherein at least one of ranking and re-ranking nets in a design based on unpredictability and expected quality-of-result impact includes:

filtering the nets of the design based on one or more predetermined criteria; and ranking nets remaining after the filtering.

3. The method of claim 2, wherein the predetermined criteria used for filtering include one or more of bounding box size, whether a net lies on a path having negative slack or small positive slack, fanout, and electrical sensitivity of a net.

4. The method of claim 3, wherein when the predetermined criteria used for filtering includes bounding box size, the filtering compares the bounding box size to a threshold value and ignores the net when the bounding box size is less than the threshold value.

5. The method of claim 3, wherein when the predetermined criteria used for filtering includes whether the net lies on a path having negative slack or small positive slack, the filtering ignores the net when it has a slack greater than a predetermined value.

6. The method of claim 5, wherein the predetermined value is a function of an operating frequency of the design.

7. The method of claim 3, wherein when the predetermined criteria used for filtering includes electrical sensitivity, determining sensitivity includes one of:

estimating a maximum increase in a length of the net that will cause the net to become timing-critical;

estimating a maximum increase in a length of the net before a total capacitance of the net and its sink pins becomes greater than a maximum permissible capacitance for a driver of the net; and estimating a maximum increase in a length of the net before a slew at a sink pin of the net becomes worse than a worst permissible slew, wherein filtering includes ignoring nets having low sensitivity.

8. The method of claim 3, wherein when the predetermined criteria used for filtering includes fanout, the filtering includes ignoring 2-pin nets with low sensitivity.

9. The method of claim 3, wherein ranking includes using one or more cost functions.

10. The method of claim 9, wherein each cost function is based on at least one of electrical sensitivity, slack, delay, fanout, and bounding box size.

11. The method of claim 10, wherein the cost function ranks nets based on electrical sensitivity.

12. The method of claim 10, wherein the cost function ranks nets based a product of functions that depend on slack, delay, and fanout.

13. The method of claim 12, wherein a function that depends on slack is one of a timing slack of a net augmented by a predetermined margin and a product of an augmented slack and a slack weight.

14. The method of claim 13, wherein the predetermined margin is a slack offset.

15. The method of claim 14, wherein the slack weight is obtained from a Gaussian distribution having a mean at a worst negative slack and a standard deviation given by (slack offset−worst negative slack)/3.

16. The method of claim 14, wherein the slack offset is a function of an operating frequency of the design.

17. The method of claim 12, wherein a function that depends on delay is one of a delay of the net itself or a square root of the delay of the net.

18. The method of claim 12, wherein a function that depends on fanout is one of a square root of the fanout f of the net or the expression $(1+\log f)^k$ where k is a positive number.

19. The method of claim 10, wherein the cost function ranks nets based on a product of functions that depend on electrical sensitivity and fanout.

20. The method of claim 19, wherein a function that depends on fanout is one of a square root of the fanout f of the net and the expression $(1+\log f)^k$ where k is a positive number.

21. The method of claim 19, wherein a function that depends on electrical sensitivity is one of electrical sensitivity itself or an electrical sensitivity raised to a predetermined positive power that is greater than or equal to 1.

22. The method of claim 10, wherein the cost function ranks nets based on a product of functions that depend on electrical sensitivity, fanout, and bounding box size.

23. The method of claim 22, wherein a function that depends on electrical sensitivity is one of electrical sensitivity itself or an electrical sensitivity raised to a predetermined positive power that is greater than or equal to 1.

24. The method of claim 22, wherein a function that depends on fanout is one of a square root of the fanout f of the net and the expression $(1+\log f)^k$ where k is a positive number.

25. The method of claim 22, wherein a function that depends on bounding box size is one of a half-perimeter of a smallest rectangle that encloses all pins of the net and a square root of the half-perimeter.

26. The method of claim 10, wherein the cost function ranks nets based on a product of functions that depend on electrical sensitivity, fanout, delay, and slack.

27. The method of claim 26, wherein a function that depends on electrical sensitivity is one of the electrical sensitivity itself or an electrical sensitivity raised to a predetermined positive power that is greater than or equal to 1.

28. The method of claim 26, wherein a function that depends on fanout is one of a square root of the fanout f of the net and the expression $(1+\log f)^k$ where k is a positive number.

29. The method of claim 26, wherein a function that depends on delay is one of a delay of the net itself or a square root of the delay of the net.

30. The method of claim 26, wherein a function that depends on slack is one of a timing slack of a net augmented by a predetermined margin and a product of an augmented slack and a slack weight.

31. The method of claim 30, wherein the predetermined margin is a slack offset.

32. The method of claim 31, wherein the slack weight is obtained from a Gaussian distribution having a mean at a worst negative slack and a standard deviation given by (slack offset−worst negative slack)/3.

33. The method of claim 31, wherein the slack offset is a function of an operating frequency of the design.

34. The method of claim 10, wherein ranking nets and re-ranking nets each includes forming a priority queue of a predetermined size, wherein a new net is inserted into the priority queue only when its cost function is better than that of a worst net currently in the priority queue.

35. A computer readable storage device comprising computer instructions that, when run on a computer, generate signals to control the process steps of:
  ranking nets in a design based on unpredictability and expected quality-of-result impact;
  selecting a first predetermined top percentage of the ranked nets as first persistent nets;
  performing timing-driven global routing on the first persistent nets;
  back-annotating a timing graph with actual delays and parasitics determined by performing the timing-driven global routing on the first persistent nets;
  running synthesis for the nets in the design using the actual delays and the parasitics for the first persistent nets, wherein the synthesis maintains and updates routing for the first persistent nets;
  re-ranking the nets in the design after synthesis based on unpredictability and expected quality-of-result impact;
  selecting a second predetermined top percentage of the re-ranked nets as second persistent nets;
  performing timing-driven global routing on the second persistent nets that had not been selected among the first persistent nets;
  performing global routing on the nets of the design while maintaining the existing routes of the second persistent nets; and
  outputting a final layout of the design based on the global routing.

36. The computer readable storage device of claim 35, wherein at least one of ranking and re-ranking nets in a design based on unpredictability and expected quality-of-result impact includes:
  filtering the nets of the design based on one or more predetermined criteria; and
  ranking the nets remaining after the filtering.

37. The computer readable storage device of claim 36, wherein the predetermined criteria used for the filtering include one or more of bounding box size, whether a net lies on a path having negative slack or small positive slack, fanout, and the electrical sensitivity of the net.

38. The computer-readable storage device of claim 37, wherein when the predetermined criteria used for filtering includes bounding box size, the filtering compares the bounding box size to a threshold value and ignores the net when the bounding box size is less than the threshold value.

39. The computer readable storage device of claim 37, wherein when the predetermined criteria used for filtering includes whether the net lies on a path having negative slack or small positive slack, the filtering ignores the net when it has a slack greater than a predetermined value.

40. The computer readable storage device of claim 39, wherein the predetermined value is a function of an operating frequency of the design.

41. The computer readable storage device of claim 37, wherein when the predetermined criteria used for filtering includes electrical sensitivity, determining sensitivity includes one of:
  estimating a maximum increase in a length of the net that will cause the net to become timing-critical;
  estimating a maximum increase in a length of the net before a total capacitance of the net and its sink pins becomes greater than a maximum permissible capacitance for a driver of the net; and
  estimating a maximum increase in a length of the net before a slew at a sink pin of the net becomes worse than a worst permissible slew,
  wherein filtering includes ignoring nets having low sensitivity.

42. The computer-readable storage device of claim 37, wherein when the predetermined criteria used for filtering includes fanout, the filtering includes ignoring 2-pin nets with low sensitivity.

43. The computer readable storage device of claim 37, wherein ranking includes using one or more cost functions.

44. The computer readable storage device of claim 43, wherein each cost function is based on at least one of electrical sensitivity, slack, delay, fanout, and bounding box size.

45. The computer readable storage device of claim 44, wherein the cost function ranks nets based on electrical sensitivity.

46. The computer readable storage device of claim 44, wherein the cost function ranks nets based a product of functions that depend on slack, delay, and fanout.

47. The computer readable storage device of claim 44, wherein the cost function ranks nets based on a product of functions that depend on electrical sensitivity and fanout.

48. The computer readable storage device of claim 44, wherein the cost function ranks nets based on a product of functions that depend on electrical sensitivity, fanout, and bounding box size.

49. The computer readable storage device of claim 44, wherein the cost function ranks nets based on a product of functions that depend on electrical sensitivity, fanout, delay, and slack.

50. The computer readable storage device of claim 44, wherein ranking nets and re-ranking nets each includes forming a priority queue of a predetermined size, wherein a new net is inserted into the priority queue only when its cost function is better than that of a worst net currently in the priority queue.

51. A persistence-driven optimization tool executable by a computer and stored on a computer-readable storage device, the persistence-driven optimization tool comprising:
  a net selection module for filtering and ranking nets in a design based on unpredictability and expected quality-of-result impact, the net selection module outputting a list of selected nets;
  an interconnect-synthesis module for performing timing-driven topology generation, layer assignment, and global routing of the selected nets, the interconnect-synthesis module outputting persistent global routes having actual parasitics and delays for the selected nets;
  an interconnect-aware circuit optimization module for driving placement-driven optimization based on the actual parasitics and delays for the persistent global routes while maintaining and updating these persistent routes, the interconnect-aware circuit optimization module outputting an optimized design with the persistent global routes; and
  a global route translation and preservation module for translating the persistent global routes into a format recognized by the routing database as pre-existing global routes to be preserved during global routing, the global route translation and preservation module outputting a design file suitable for global routing followed by subsequent routing steps such as track assignment and detailed routing and post-route optimization.

* * * * *

UNITED STATES PATENT AND TRADEMARK OFFICE
CERTIFICATE OF CORRECTION

| | | |
|---|---|---|
| PATENT NO. | : 7,853,915 B2 | Page 1 of 1 |
| APPLICATION NO. | : 12/145405 | |
| DATED | : December 14, 2010 | |
| INVENTOR(S) | : Prashant Saxena et al. | |

It is certified that error appears in the above-identified patent and that said Letters Patent is hereby corrected as shown below:

Column 17
Line 66, insert -- on -- before "a".

Column 20
Line 19, insert -- on -- before "a".

Signed and Sealed this
Eighth Day of March, 2011

David J. Kappos
*Director of the United States Patent and Trademark Office*